United States Patent [19]
Okun et al.

[11] Patent Number: 5,184,322
[45] Date of Patent: Feb. 2, 1993

[54] OPTICAL STORAGE DEVICE WITH A STATIONARY MASS STORAGE MEDIUM

[76] Inventors: Nathan Okun, 1735 Callas Ct., Oxnard, Calif. 93035; John Engberg, 2855 Harbor Blvd., Ventura, Calif. 93001

[21] Appl. No.: 471,765

[22] Filed: Jan. 29, 1990

[51] Int. Cl.⁵ .................. G11C 13/06; G11C 13/04; G11C 7/00; G11B 13/00
[52] U.S. Cl. .................. 365/122; 365/124; 365/215; 369/13
[58] Field of Search .......... 365/64, 120, 122, 124, 365/215, 118; 350/6.1, 6.6, 6.7, 6.8, 6.9; 369/13, 45, 119; 354/4; 346/33 A, 150, 160

[56] References Cited

U.S. PATENT DOCUMENTS

| | | | |
|---|---|---|---|
| 3,865,465 | 2/1975 | Tatuoka et al. | 350/6.8 |
| 3,868,658 | 2/1975 | Kiemle | 365/215 |
| 3,872,451 | 3/1975 | McNaney | 350/6.8 |
| 3,905,040 | 9/1975 | Otala | 369/13 |
| 3,928,458 | 8/1976 | Vergnolle et al. | 365/64 |
| 4,445,209 | 4/1984 | Mickelson et al. | 365/45 |
| 4,587,648 | 5/1986 | Ando | 369/275 |
| 4,607,356 | 8/1986 | Bricot et al. | 369/44 |
| 4,674,070 | 6/1987 | Tajima et al. | 369/46 |
| 4,688,201 | 8/1987 | Towner et al. | 369/44 |
| 4,796,038 | 1/1989 | Allen et al. | 354/4 |
| 4,813,772 | 3/1989 | Kowel et al. | 365/64 |
| 4,922,454 | 5/1990 | Taki | 369/13 |
| 4,971,414 | 11/1990 | Funato et al. | 346/33 A |
| 4,977,540 | 12/1990 | Goodwin et al. | 365/120 X |

OTHER PUBLICATIONS

Chen et al., "An Overview of Optical Data Storage Technology", Proc. IEEE, vol. 63, No. 8, Aug. 1985, pp. 1207-1230.

Primary Examiner—Joseph L. Dixon
Assistant Examiner—Michael A. Whitfield
Attorney, Agent, or Firm—Tamara L. Weber; Edward J. Connors; William C. Townsend

[57] ABSTRACT

An optical storage device having a mass storage medium which remains stationary as data is transferred by a laser. The stationary mass storage medium permits rapid data transfer since delay due to rotation of the medium, as in a compact disk, is eliminated.

10 Claims, 3 Drawing Sheets

OPTICAL STORAGE DEVICE WITH A STATIONARY MASS STORAGE MEDIUM

STATEMENT OF GOVERNMENT INTEREST

The invention described herein may be manufactured and used by or for the Government of the United States of America for Governmental purposes without the payment of any royalties thereon or therefor.

FIELD OF THE INVENTION

This invention relates to optical storage devices, and more particularly to an optical storage device with a mass storage medium that remains stationary as data is transferred to and from the mass storage medium by means of a laser.

BACKGROUND OF THE INVENTION

Current optical mass storage devices record data on a small disk. The disk spins at a controlled rate on a spindle. A read/write head is held close to the surface of the disk. The head moves radially to scan a given ring-shaped track on which data is stored.

Using current optical mass storage devices, data transfer is delayed by: (1) the time required to find the correct location of the data on the disk, and (2) the time required for the disk to rotate while the data is transferred. When a moving disk is used in an optical mass storage device, the location of the beginning of the data is randomly delayed by the current position of the disk in relation to the head. If the beginning of the data has just passed the head, the wait is maximized to the time it takes for the disk to make nearly an entire revolution. In cases where the data is chopped up into separate pieces located at random on the disk surface, these delays can add up to a significant amount of the total read/write time. This problem is further aggravated by the delay caused by the time required for a spinning disk to reach operating speed.

When a rotating disk is used as a recording medium, data reading and writing can only be performed at the speed at which the data passes in front of the fixed head. Even when high speed hard disks are used, the data rate is far slower than the maximum rate at which the electronic circuits in the attached computer could function. As new ultra-high-speed devices such as Very High Speed Integrated Circuit (VHSIC) come into use, the disparity between the electronic devices and the mechanical mass storage devices is going to widen dramatically. This is the primary limitation of any data storage device which requires a moving medium.

SUMMARY OF THE INVENTION

The present invention is an improved optical mass storage device which performs reading and writing functions more rapidly than current optical storage devices because the mass storage medium remains stationary as a scanning laser transfers data to and from the medium.

A mass storage medium is a data storage medium capable of storing over 100 million bits of information per square inch. The present invention uses a narrow-beam laser capable of focusing light on a single pixel point on the surface of a mass storage medium. The reading function outputs a laser beam of a fixed intensity which reflects off of the mass storage medium surface and onto the receiver A coding scheme is used to read the pixel as a "1" or a "0" when the laser beam reaches the receiver. It is noted that the data transfer rate can be further increased by using pixels with more than two levels of reflectivity. Therefore, "n" number of bits can be stored per pixel if each pixel can have 2 to the "n" power levels. This is limited only by the sensitivity of the receiver and the technique used by and the resolution of the writing device.

The primary feature of this invention is a focusing and scanning system which permits location of the source of the laser beam off of the mass storage medium such that the entire surface of the mass storage medium is in view of the laser beam. Either a single laser is scanned in both the elevation plane (toward the laser or away in the preferred mode) and traverse plane (side to side), or several adjacent lasers scanning primarily in the elevation plane only could be employed.

The laser to generate a reading beam can be any of those available for current compact disk systems When the laser beam is used for writing, rather than reading, it must be boosted to a much higher energy level. A combined laser/magnetic media is one method of creating an erasable optic medium The laser energizes the pixel which then becomes susceptible to a change in polarity caused by a local magnetic field This change in polarity alters the reflectivity of the pixel, which can then be read by the laser. This effect is similar to that of a Liquid Crystal Display (LCD), which changes optical properties when an electric current is applied. Note that only the combination of laser energy and magnetic field can change the pixel, so that the read laser alone cannot modify the data. Writing and erasing can be done by applying the magnetic field over a large part, or even the entire surface, of the medium and firing a laser at the pixels to be changed. Fine control of the magnetic field is therefore not necessary.

There are several possible methods of scanning the laser beam over the mass storage medium surface, including, but not limited to:

a. mechanically rotating mirrors with a pulsed beam that is timed in synchronization with the mirror position;

b. using a transparent lens that can be reshaped using electric or magnetic stimuli over a limited range, such as a piezoelectric crystal;

c. using a number of lasers with very limited traverse motion; and d. using a receiver which is capable of discriminating between several simultaneous reflections at varying light frequencies. A laser can emit a single frequency of light or several different frequencies simultaneously. Most optical devices, such as prisms, that focus or change the direction of the laser beam are frequency sensitive, in that different light frequencies will be deflected in slightly different directions. In most laser uses, only a single frequency is desired and the others that may be produced are either internally absorbed or deflected away from the target. In this optical storage device, however, several simultaneous beams from a single laser device scan the mass storage medium in parallel, greatly speeding up the reading process. Each frequency of light strikes a different pixel along a row and reflects to a frequency-sensitive focusing device. The beam then passes to the receiver, which sorts the responses at each frequency and assembles them into data words. This is not possible with conventional compact disk systems due to the close proximity of the read/write head and the mass storage medium.

The reading laser system receiver is a focusing lens or staring array receiver capable of viewing the entire surface of the mass storage medium. When the laser beam is scanning the mass storage medium during the reading process, it needs to be extremely sharp and pointed very precisely. However, the reflection from the illuminated spot may spread out in all directions. Thus, the receiver looking at the optical mass storage medium can be a wide-angle lens capable of focusing any light from any point on the optical mass storage medium onto the receiver element at the receiver's center. No imaging is needed by the receiver element of this focusing lens receiver since only a single point (at the given frequency, if more than one laser beam is being used at one time) on the optical mass storage medium's surface is being illuminated by the reading laser at any time.

A staring array receiver consists of several independent fixed receivers, each of which is aimed at a different area of the mass storage medium and/or tuned to a different frequency range. This allows increased data rates when multiple read operations are going on simultaneously. Each element in the array consists of a single lens with a receiving device behind it and its own data path back to the processor reading in the information.

The receiver must be sensitive to the particular laser frequencies in use and preferably no others, and have a minimum energy level for activation which protects it from inadvertent activation due to stray reflections. After the response to the laser beam has passed into the internal circuits of the receiver, the information processing is identical to that which occurs in conventional compact disk systems. Since the receiver is not in physical contact with the mass storage medium, the receiver can be hard-mounted at any convenient position which permits a good view of the entire mass storage medium surface.

The receiver need not be positioned anywhere near the laser transmitter. In fact, by placing the laser above one edge of the mass storage medium and the receiver at the opposite edge of the mass storage medium and projecting the laser at a shallow angle against the medium, the required laser energy is lowered significantly since more energy is concentrated on the receiver. The required laser energy levels are further reduced by precutting microscopic grooves or pixels in the medium surface at varying angles so as to focus the reflected energy at the receiver.

It may soon be possible to scan the laser beam over the mass storage medium surface by changing the frequency of the laser beam. Changing the frequency of a laser beam and projecting it through a prism causes the beam to shift its position in the same manner as a rainbow is made from a single beam of white light. This would eliminate most of the moving parts in the laser beam scanning device, but would also require a new laser with the ability to rapidly tune its output frequency over a continuous range with very high reliability.

It may also soon be possible to generate a beam for reading and writing information on a mass storage medium through electronic emulation of optical mirrors and lenses. Most optical or radio frequency devices use a lens or mirror to shape the beam to the desired form and to focus it at the target. However, many modern radar systems do not use a physical antenna, but instead have a flat plate-shaped array consisting of many tiny, low-power transmitters, each of which is individually controlled by a computer as to its power output at each instant. By turning these individual elements on and off at the proper time, it is possible to sum their outputs in such a way that the radiated signal has all of the characteristics of a beam made by a physical antenna. Also, by changing the time when these individual elements are turned on and off, many different kinds of "real" antenna beam patterns could be emulated or one or more moving antenna beams could be created. Since such a system would contain no moving parts, it would make possible electronic emulation of optical mirrors and lenses at electronic speeds.

BRIEF DESCRIPTION OF THE DRAWINGS

The invention will be best understood by referring to the accompanying drawings, wherein.

DETAILED DESCRIPTION

Figure 1:
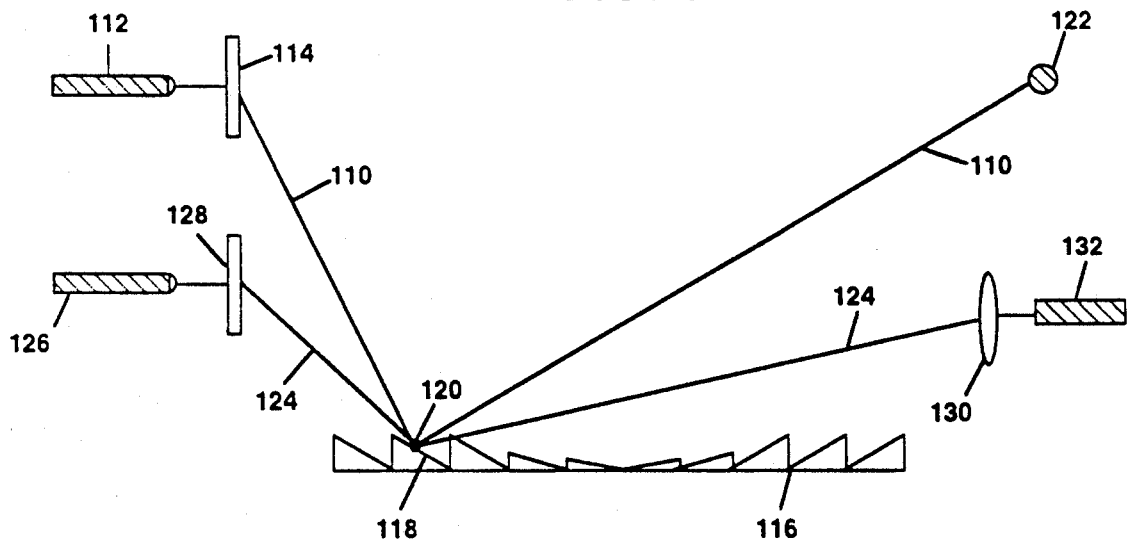
FIG. 1 illustrates the read and write functions of an optical mass storage device with a piezoelectric crystal lens scanning device and a focusing lens receiver.

FIG. 1 illustrates the write and read functions of an optical mass storage device with a piezoelectric crystal lens scanning device and a focusing lens receiver.

A write laser beam 110 is emitted from a write laser transmitter 112. Beam 110 passes from transmitter 112 through a first piezoelectric crystal lens 114. Lens 114 focuses beam 110 onto the surface of a mass storage medium 116 with pixel areas 118. Beam 110 strikes the pixel area 118 and burns a small pit 120 in the pixel area 118 according to a coding scheme used to define the pixel area 118 as a "1" or "0" state. Beam 110 is then reflected off of the pixel area 118 and onto a piece of energy absorbing material 122. This material 122 prevents any reflections from the beam 110 from modifying non-selected portions of the storage medium 116.

A read laser beam 124 is emitted from a read laser transmitter 126. The read laser beam 124 passes from the read laser transmitter 126 and then through a second piezoelectric crystal lens 128. Lens 128 focuses beam 124 onto the surface of the mass storage medium 116 with pixel storage areas 118. Beam 124 illuminates the pit 120 on the pixel area 118, and then reflects off of the pixel area 118 and onto a focusing lens 130. Lens 130 focuses the beam 124 onto a read beam receiver 132. A coding scheme is used to read the fluctuations in the read beam reflected strength as a "1" or a "0" when beam 124 is received by receiver 132.

Figure 2:
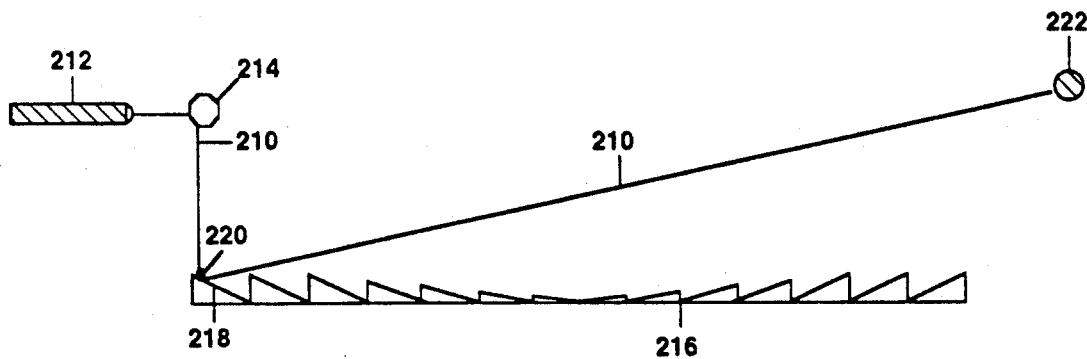
FIG. 2 illustrates the write function of an optical mass storage device with a rotating mirror scanning device. Writing is performed by burning a small pit in the pixel area with a beam.

FIG. 2 illustrates the write function of an optical mass storage device with a rotating mirror scanning device. A laser beam 210 is emitted from a transmitter 212. Beam 210 passes from the transmitter 212 and then through a rotating mirror scanning device 214. Device 214 focuses the laser beam 210 onto the surface of a mass storage medium 216 with pixel areas 218. Beam 210 strikes the pixel area 218 and burns a small pit 220 in the pixel area 218 according to a coding scheme used to define the pixel area 218 as a "1" or "0" state. Beam 210 is then reflected off of the pixel area 218 and onto a piece of energy absorbing material 222.

Figure 3:
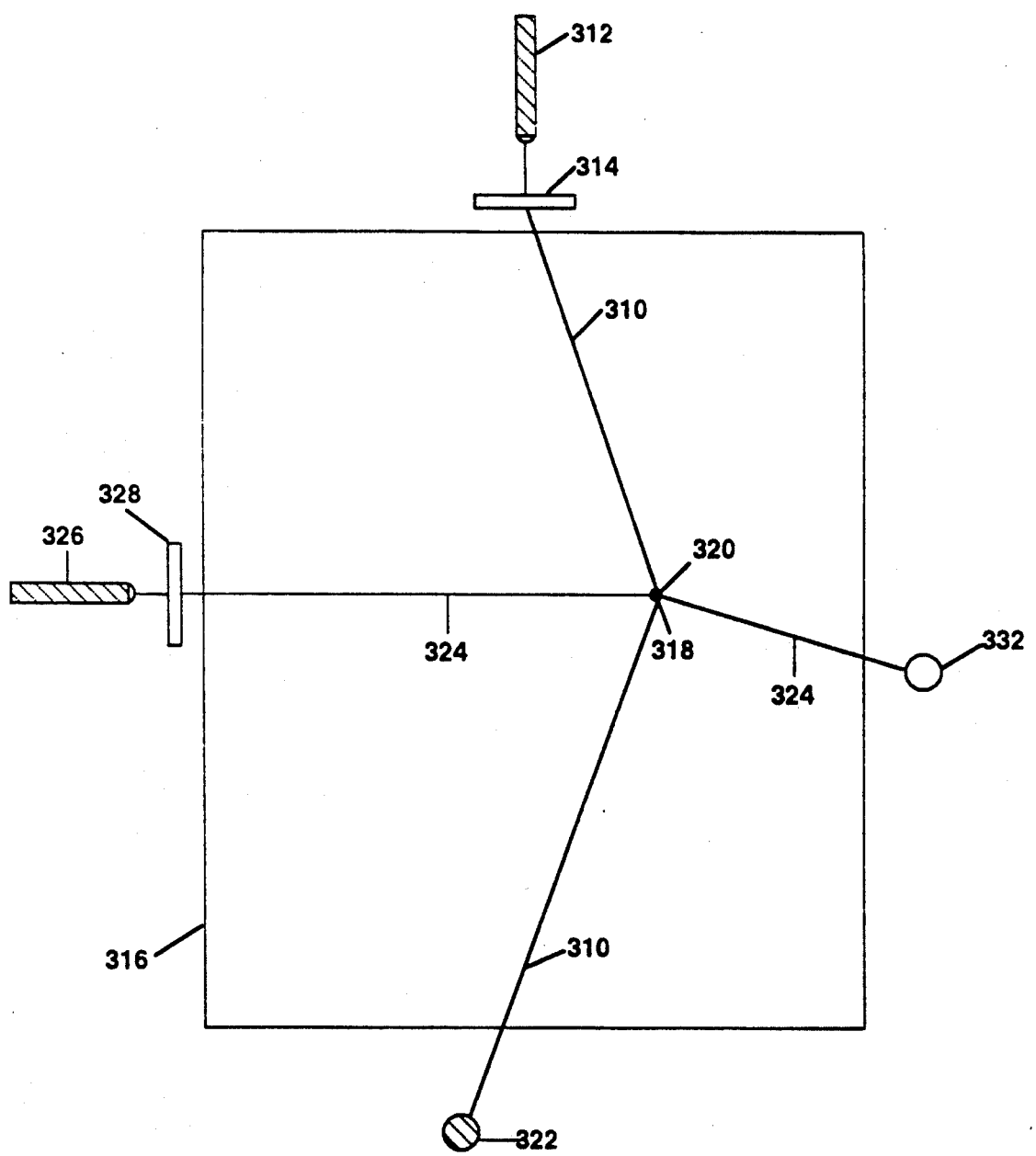
FIG. 3 illustrates an optical mass storage device with a perpendicular arrangement of read and write lasers and a staring array receiver.

FIG. 3 illustrates an optical mass storage device with a perpendicular arrangement of write and read lasers.

A write laser beam 310 is emitted from a write laser transmitter 312. Beam 310 passes from transmitter 312 through a first piezoelectric crystal lens 314. Lens 314 focuses beam 310 onto the surface of a mass storage medium 316 with pixel storage areas 318. A coding scheme is used to define the pixel areas 318 as a "1" or "0" state when beam 310 strikes the pixel 318 and burns a small pit 320 in the pixel 318. Beam 310 is then reflected off of the pixel area 318 and onto a piece of energy absorbing material 322.

A read laser beam 324 is emitted from a read laser transmitter 326. Beam 324 passes from transmitter 326 through a second piezoelectric crystal lens 328. Lens 328 focuses beam 324 onto the surface of the mass storage medium 316 with pixel storage areas 318. Beam 324 illuminates the pit 320 on the pixel 318, and then reflects off of the pixel area 318 and onto a staring array receiver 332. A coding scheme is used to read the fluctuations in the read beam reflected strength as a "1" or a "0" when beam 324 is received by receiver 332.

Figure 4:
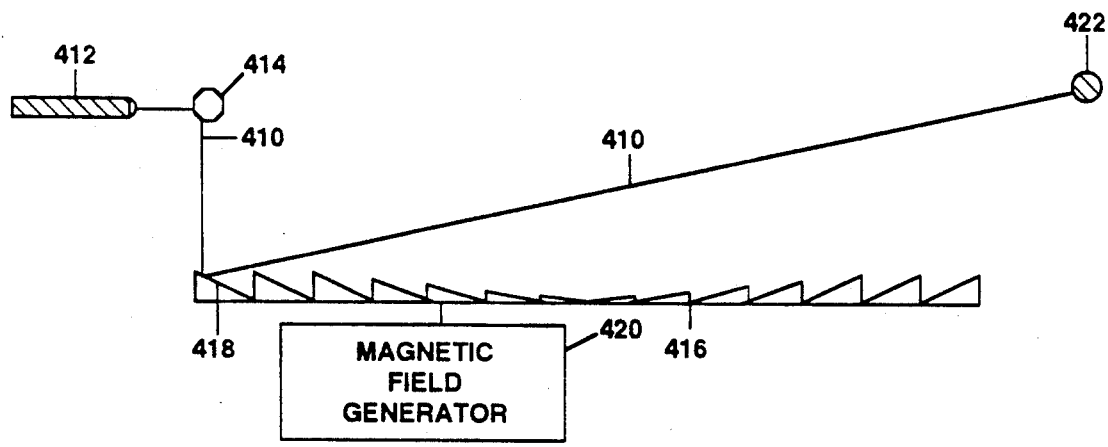
FIG. 4 illustrates the write function of an optical mass storage device with a rotating mirror scanning device. Writing is performed by directing a laser on a magnetic medium.

FIG. 4 illustrates the write function of an optical mass storage device with a rotating mirror scanning device. A laser beam 410 is emitted from a transmitter 412. Beam 410 passes from the transmitter 412 and then through a rotating mirror scanning device 414. Device 414 focuses the laser beam 410 onto the surface of a mass storage medium 416 with pixel areas 418. A magnetic field generator 420 creates a local magnetic field on the mass storage medium 416. The beam 410 energizes the pixel area 418, causing the pixel area 418 to become susceptible to a change in polarity caused by the local magnetic field. This change in polarity alters the reflectivity of the pixel area 418. Beam 410 is then reflected off of the pixel area 418 and onto a piece of energy absorbing material 422. FIG. 4 incorporates a magnetic field generator 420 into FIG. 2. It should be understood that the magnetic field generator 420 of this FIG. 4 could also be incorporated into FIG. 1 and FIG. 3 to provide an erasable optic medium for the write functions illustrated in FIG. 1 and FIG. 3.

The invention has been described in detail with particular reference to certain preferred embodiments thereof, but will be understood that variations and modifications can be effected within the spirit and scope of the invention.

What I claim is:

1. A data storage device comprising:
   a. a laser scanning device means for emitting a scanning laser beam,
   b. a mass storage medium which remains stationary as data is transferred by said laser scanning means from said mass storage medium, and
   c. a staring array receiver for receiving said data from said mass storage medium by said scanning laser beam,
   d. wherein, said mass storage medium remains stationary while said data is located by said laser scanning means.

2. The device of claim 1 wherein said laser scanning means comprises:
   a. a stationary laser beam transmitter for generating said scanning laser beam, and
   b. means for causing said scanning laser beam to scan selected parts of said mass storage medium.

3. The device of claim 2 wherein said means for causing said scanning laser beam to scan selected parts of said mass storage medium comprises a piezoelectric crystal lens.

4. The device of claim 2 wherein said means for causing said scanning laser beam to scan selected parts of said mass storage medium comprises a rotating mirror scanning device.

5. A method for reading data stored on a stationary mass storage medium comprising the steps of:
   a. generating a scanning laser beam with a stationary laser beam transmitter,
   b. directing said scanning laser beam towards a piezoelectric crystal lens,
   c. whereby, said scanning laser beam passes through said piezoelectric crystal lens and scans selected parts of said stationary mass storage medium,
   d. positioning a receiver at such an angle that said scanning laser beam strikes said receiver after said scanning laser beam reflects off said stationary mass storage medium, and
   e. using a coding scheme to assign said scanning laser beam a value of "1" or "0" depending upon the intensity of said scanning laser beam at said, receiver.

6. A method for reading data stored on a stationary mass storage medium comprising the steps of:
   a. generating a scanning laser beam with a stationary laser beam transmitter,
   b. directing said scanning laser beam towards a rotating mirror scanning device,
   c. whereby, said scanning laser beam reflects off said rotating mirror scanning device and scans selected parts of said stationary mass storage medium,
   d. positioning a receiver at such an angle that said scanning laser beam strikes said receiver after said scanning laser beam reflects off said stationary mass storage medium, and
   e. using a coding scheme to assign said scanning laser beam a value of "1" or "0" depending upon the intensity of said scanning laser beam at said receiver.

7. A method for writing data onto a stationary mass storage medium comprising the steps of:
   a. generating a scanning laser beam with a stationary laser beam transmitter,
   b. directing said scanning laser beam toward a rotating mirror scanning device,
   c. whereby, said scanning laser beam reflects off said rotating mirror scanning device and scans selected parts of said stationary mass storage medium, and
   d. generating a local magnetic field,
   e. whereby, the combination of said local magnetic field and the energy of said scanning laser beam writes the data on said stationary mass storage medium.

8. A data storage device comprising:
   a. a mass storage medium which remains stationary as data is transferred onto said mass storage medium,
   b. a stationary laser beam transmitter for generating a scanning laser beam, and
   c. a rotating mirror scanning device for causing said scanning laser beam to scan selected parts of said mass storage medium, d. wherein, said mass storage medium remains stationary while said data is located by said scanning laser beam.

9. A data storage device comprising:
a. a first stationary laser beam transmitter means for generating a first read scanning laser beam,
b. a first rotating mirror scanning device for focusing said first read scanning laser beam,
c. a stationary mass storage medium,
d. a first pixel storage area on said stationary mass storage medium,
e. wherein, said first read scanning laser beam transmitted by said first stationary laser beam transmitter means reflects off said first rotating mirror scanning device and is focused on said first pixel storage area of said stationary mass storage medium,
f. a staring array receiver,
g. wherein, said staring array receiver reads the data which said first read scanning laser beam transmitted from said first pixel storage area on said stationary mass storage medium,
h. a second stationary laser beam transmitter means for generating a second read scanning laser beam,
i. a second rotating mirror scanning device for focusing said second read scanning laser beam, and
j. a second pixel storage area on said stationary mass storage medium,
k. wherein, said second read scanning laser beam transmitted by said second stationary laser beam transmitter means reflects off said second rotating mirror scanning device and is focused on said second pixel storage area of said stationary mass storage medium, and
l. wherein, said staring array receiver reads the data which said second read scanning laser beam transmitted from said second pixel storage area on said stationary mass storage medium at the same time as said staring array receiver reads the data which said first read scanning laser beam transmitted from said first pixel storage area on said stationary mass storage medium.

10. A data storage device comprising:
a. a first stationary laser beam transmitter means for generating a write scanning laser beam,
b. a stationary mass storage medium,
c. a first rotating mirror scanning device for focusing said write scanning laser beam on selected parts of said stationary mass storage medium,
d. a pixel storage area on said stationary mass storage medium,
e. wherein, said write scanning laser beam transmitted by said first stationary laser beam transmitter means reflects off said first rotating mirror scanning device and is focused on said pixel storage area of said stationary mass storage medium,
f. a magnetic field generator,
g. wherein, said magnetic field generator generates a local magnetic field on said stationary mass storage medium,
h. wherein, the energy provided by said local magnetic field allows said write scanning laser beam to transfer data onto said pixel storage area of said stationary mass storage medium,
i. a second stationary laser beam transmitter means for generating a read scanning laser beam,
j. a second rotating mirror scanning device for focusing said read scanning laser beam on said pixel storage area of said stationary mass storage medium,
k. wherein, said read scanning laser beam transmitted by said second stationary laser beam transmitter means reflects off said second rotating mirror scanning device and is focused on said stationary mass storage medium,
l. wherein, said stationary mass storage medium and said second stationary laser beam transmitter means remain stationary as said read scanning laser beam locates said pixel storage area of said stationary mass storage medium,
m. a read receiver, and
n. a focusing lens means for focusing said read scanning laser beam on said read receiver,
o. wherein, said read scanning laser beam focused on said pixel storage area of said stationary mass storage medium is reflected through said focusing lens means of said read receiver, and
p. wherein, said read receiver reads said data transferred onto said pixel storage area of said stationary mass storage medium by said write scanning laser beam.

* * * * *